(12) United States Patent
Wang et al.

(10) Patent No.: US 12,016,115 B2
(45) Date of Patent: Jun. 18, 2024

(54) EMBEDDED CIRCUIT BOARD, ELECTRONIC DEVICE, AND FABRICATION METHOD THEREFOR

(71) Applicant: SHENNAN CIRCUITS CO., LTD., Shenzhen (CN)

(72) Inventors: Beilei Wang, Shenzhen (CN); Weijing Guo, Shenzhen (CN); Zhanhao Xie, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 122 days.

(21) Appl. No.: 17/956,999

(22) Filed: Sep. 30, 2022

(65) Prior Publication Data

US 2023/0023144 A1    Jan. 26, 2023

Related U.S. Application Data

(63) Continuation of application No. PCT/CN2020/083826, filed on Apr. 8, 2020.

(51) Int. Cl.
| | |
|---|---|
| H05K 1/11 | (2006.01) |
| H05K 1/02 | (2006.01) |
| H05K 3/10 | (2006.01) |

(52) U.S. Cl.
CPC .......... *H05K 1/0263* (2013.01); *H05K 1/113* (2013.01); *H05K 3/103* (2013.01);
(Continued)

(58) Field of Classification Search
CPC .......... H05K 1/113; H05K 1/165; H05K 1/03; H05K 1/0306
See application file for complete search history.

(56) References Cited

U.S. PATENT DOCUMENTS

| | | |
|---|---|---|
| 2012/0320532 A1 | 12/2012 | Wang |
| 2014/0247269 A1 | 9/2014 | Berdy et al. |

(Continued)

FOREIGN PATENT DOCUMENTS

| | | |
|---|---|---|
| CN | 102933040 A | 2/2013 |
| CN | 103716999 A | 4/2014 |

(Continued)

OTHER PUBLICATIONS

Japanese Notice of Reasons for Refusal, Japanese Patent Application No. 2022-559641, mailed Oct. 3, 2023(8 pages).

(Continued)

*Primary Examiner* — Jeremy C Norris

(57) ABSTRACT

Disclosed are an embedded circuit board and a fabrication method therefor. The embedded circuit board comprises: a circuit board body; signal transmission layers (1200), wherein the signal transmission layers are arranged on two opposite sides of the circuit board body; bonding layers, wherein the bonding layers are arranged between at least one signal transmission layer and the circuit board body and used for bonding the signal transmission layer to the circuit board body; metal bases which are embedded in the circuit board body and are electrically connected to the signal transmission layers on two opposite sides of the circuit board body; conductive parts which are arranged at the positions in the bonding layers corresponding to the metal bases, and are electrically connected to the signal transmission layer and the metal bases; and magnetic cores embedded in the circuit board body.

20 Claims, 5 Drawing Sheets

(52) U.S. Cl.
CPC . *H05K 2201/0355* (2013.01); *H05K 2201/07* (2013.01); *H05K 2201/08* (2013.01)

(56) References Cited

U.S. PATENT DOCUMENTS

| | | | |
|---|---|---|---|
| 2016/0111196 | A1 | 4/2016 | Francis |
| 2017/0025218 | A1 | 1/2017 | Sugiyama et al. |
| 2019/0333674 | A1 | 10/2019 | Quilici |
| 2019/0333681 | A1 | 10/2019 | Wang et al. |
| 2019/0341182 | A1 | 11/2019 | Guo et al. |

FOREIGN PATENT DOCUMENTS

| | | |
|---|---|---|
| CN | 106163106 A | 11/2016 |
| CN | 106576423 A | 4/2017 |
| CN | 108471670 A | 8/2018 |
| CN | 208141947 U | 11/2018 |
| CN | 110415945 A | 11/2019 |
| EP | 2779810 B1 | 1/2019 |
| JP | 2001284815 A | 10/2001 |
| JP | 2002329617 A | 11/2002 |
| JP | 2004153244 A | 5/2004 |
| JP | 2014038884 A | 2/2014 |
| JP | 2016009833 A | 1/2016 |
| WO | 2015141433 A1 | 9/2015 |

OTHER PUBLICATIONS

International search report and Written Opinion of the International Search Authority, International Application No. PCT/CN2020/083827, mailed Jan. 8, 2021(13 pages).

International search report and Written Opinion of the International Search Authority, International Application No. PCT/CN2020/083826,mailed Dec. 29, 2020(12 pages).

European Search Report,European Application No. 20930094.6, mailed May 11, 2023 (10 pages).

Japanese Decision of Refusal, Japanese Patent Application No. 2022-559641, mailed Feb. 20, 2024(8 pages).

EMBEDDED CIRCUIT BOARD, ELECTRONIC DEVICE, AND FABRICATION METHOD THEREFOR

CROSS REFERENCE TO RELATED APPLICATIONS

The present application is a continuation-application of International (PCT) Patent Application No. PCT/CN2020/083826, filed on Apr. 8, 2020, and the entire contents of which are hereby incorporated by reference in their entireties.

TECHNICAL FIELD

The present disclosure relates to the field of circuit boards, and in particular to an embedded circuit board, an electronic device, and a method for fabricating the embedded circuit board.

BACKGROUND

With the continuous improvement of performances of electronic products, a design of embedding a metal base into a circuit board for heat dissipation has appeared.

The inventor of the present disclosure found that the metal base may also be configured to transmit a current when the metal base is embedded in the circuit board for heat dissipation, that is, to carry a current. The metal base needs to be electrically connected to a signal transmission layer on a surface of the circuit board at this time. However, the fixed material at a junction of the circuit board and the metal base is located at a level higher than the surface of the metal base. The copper layer at the junction of the circuit board and the metal base is thinner than other areas, which is not conducive to a large current-carrying function of the metal base.

SUMMARY OF THE DISCLOSURE

Embodiments of the present disclosure provide an embedded circuit board, an electronic device including the embedded circuit board, and a method for fabricating the embedded circuit board.

A technical solution may be adopted in the present disclosure. An embedded circuit board is provided and includes: a circuit board body; two signal transmission layers, arranged on opposite sides of the circuit board body; an adhesive layer, arranged between the circuit board body and at least one of the signal transmission layers, and configured to bond the signal transmission layers to the circuit board body; one or more metal bases, embedded in the circuit board body and electrically connected to the signal transmission layers arranged on the opposite sides of the circuit board body; a first conductive element, arranged in the adhesive layer at a position corresponding to the one or more metal bases and electrically connect the signal transmission layers to the one or more metal bases; and a magnetic core, embedded in the circuit board body.

Another technical solution may be adopted in the present disclosure. An electronic device including the embedded circuit board is provided. The electronic device including the embedded circuit board may include: a substrate, having a first side and a second side opposite to the first side; a first conductive layer, located on the first side of the substrate; a second conductive layer, located on the second side of the substrate; an adhesive layer, arranged on at least one of the first conductive layer and the second conductive layer; a conductive element, arranged in the adhesive layer and having two opposite ends exposed from the adhesive layer; and one or more metal bases, embedded in the substrate and electrically connected to the first conductive layer and the second conductive layer via the conductive element; a magnetic core, embedded in the substrate; each of the first conductive layer and the second conductive layer is configured to transmit a current and has a substantially constant thickness; and the first conductive layer, the second conductive layer, and the one or more metal bases cooperatively defines a coil circuit surrounding the magnetic core.

A further technical solution may be adopted in the present disclosure. A method for fabricating the embedded circuit board is provided. The method for fabricating the embedded circuit board may include following operations: providing a circuit board body; defining an accommodating groove in the circuit board body, arranging a metal base in the accommodating groove, and embedding a magnetic core in the circuit board body; arranging an adhesive layer on a side of the circuit board body from which the metal base is exposed; embedding a conductive element in the adhesive layer at a position corresponding to the metal base; and arranging a signal transmission layer on each side of the adhesive layer away from the circuit board body, and electrically connecting the signal transmission layer to the metal base through the conductive element.

BRIEF DESCRIPTION OF THE DRAWINGS

In order to more clearly illustrate technical solutions of embodiments of the present disclosure, accompanying drawings for the embodiments will be briefly described in the following. Obviously, the drawings in the following show only some of the embodiments of the present disclosure. Those of ordinary skill in the art may obtain other drawings based on these drawings without any creative work.

DETAILED DESCRIPTION

The technical solutions in the embodiments of the present disclosure will be clearly and completely described below in connection with the drawings in the embodiments of the present disclosure. Obviously, the described embodiments are only a part but not all of the embodiments of the present disclosure. All other embodiments obtained by those of ordinary skill in the art based on the embodiments in the present disclosure without making creative work shall fall within the scope of the present disclosure.

Figure 1:
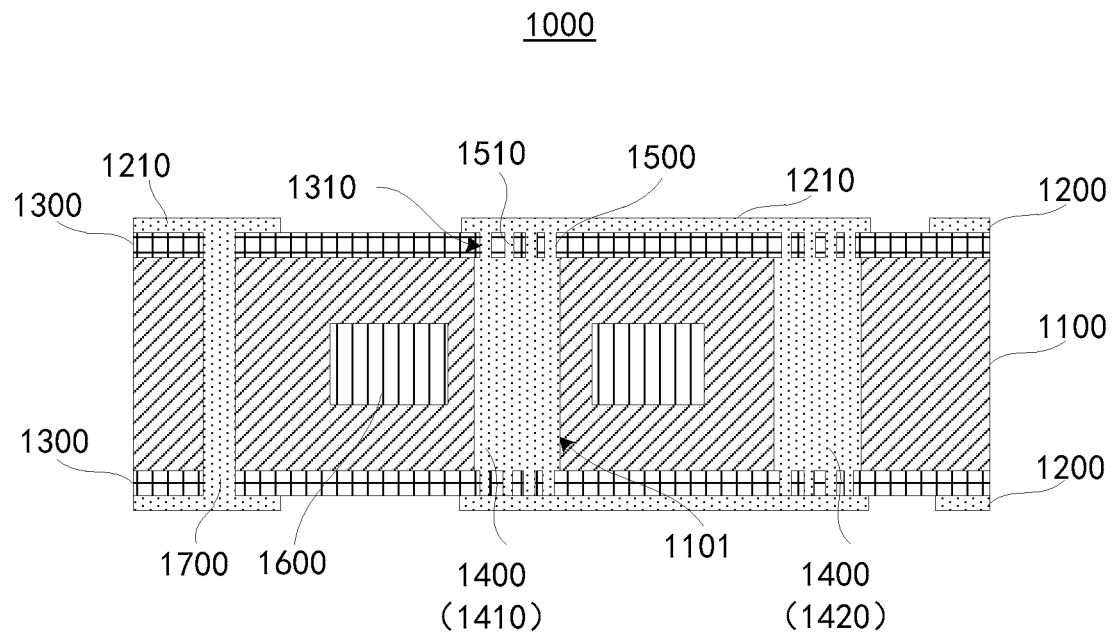
FIG. 1 is a schematic sectional view of an embedded circuit board according to some embodiments of the present disclosure.

As shown in FIG. 1, FIG. 1 is a schematic sectional view of an embedded circuit board according to some embodiments of the present disclosure. The embedded circuit board 1000 may include: a circuit board body 1100, a signal transmission layer 1200, an adhesive layer 1300, a metal base 1400, a first conductive element 1500, and a magnetic core 1600.

The circuit board body 1100 may play a main supporting role in the entire embedded circuit board 1000, and the metal base 1400 may be embedded in the circuit board body 1100. In some embodiments, two signal transmission layers 1200 are arranged or formed on opposite sides of the circuit board body 1100, one of the signal transmission layers 1200 is arranged on a side of the circuit board body 1100, and the other of the signal transmission layers 1200 is arranged on an opposite side of the circuit board body 1100. The metal base 1400 may be electrically connected to the signal transmission layers 1200 arranged or formed on opposite sides of the circuit board body 1100, it means that the metal base 1400 may have a current-carrying function. The material of metal base may be copper, aluminium or an alloy including copper and aluminium, or other conductive materials. A cross section of the metal base 1400 along a thickness direction of the metal base 1400 may be substantially rectangular, T-shaped, or in other shapes. Herein, the thickness direction of the metal base 1400 may be a thickness direction of the circuit board body. A groove 1101 may be defined in the circuit board body 1100, and the metal base 1400 may be arranged in the groove 1101. Herein, the groove 1101 may be a through groove running through or penetrating the circuit board body 1100. A size of the groove 1101 is greater than a size of the metal base 1400, or the size of the groove 1101 may be substantially equal to the size of the metal base 1400. Herein, the size of the groove 1101 may be an inner size, such as an inner diameter of the groove 1101. The size of the metal base 1400 may refer to an outer side of the metal base 1400.

The signal transmission layers 1200 may be made of conductive materials, such as copper, aluminum, and the like. The signal transmission layers 1200 may be configured to achieve the signal transmission. The adhesive layer 1300 may be arranged or formed between the at least one of the two signal transmission layers 1200 and the circuit board body 1100, and the adhesive layer 1300 may be configured to bond the at least one of the two signal transmission layers 1200 to the circuit board body 1100. The material of adhesive layer 1300 may be prepreg, epoxy resin, and the like, and will not be limited herein. In some embodiments, the adhesive layer 1300 may be arranged or formed between the each of the two signal transmission layers 1200 and the circuit board body 1100; or the adhesive layer 1300 may be arranged or formed between the only one signal transmission layer 1200 and the circuit board body 1100, and the other signal transmission layer 1200 may directly contact with the circuit board body 1100. For example, in an application scenario, the circuit board body 1100 may include a core plate (not shown), and the signal transmission layer 1200 directly contacting with the circuit board body 1100 may be a conductive layer on a surface of the core plate.

The first conductive element 1500 may be arranged or formed in the adhesive layer 1300 at a position corresponding to the metal base 1400, and the at least one of the signal transmission layers 1200 may be electrically connected to the metal base 1400 through the first conductive element 1500.

In some embodiments, the metal base 1400 may be electrically connected to the signal transmission layers 1200 through the first conductive element 1500. During the fabrication process of the embedded circuit board, the adhesive layer 1300 may be arranged or formed first on the side of the circuit board body 1100 from which the metal base 1400 is exposed after the metal base 1400 is arranged in the circuit board body 1100, then a recess may be defined in the adhesive layer 1300 at the position corresponding the metal base 1400, and the first conductive element 1500 may be arranged or formed in the recess (or the first conductive element 1500 may be arranged or formed at a position corresponding to the metal base 1400 first, and the adhesive layer 1300 may be formed after that). After that, an entire conductive layer may be arranged or formed on one side of the adhesive layer 1300 away from the circuit board body 1100. The signal transmission layers 1200 may be arranged or formed by using the entire conductive layer subsequently. Therefore, it may ensure that the thickness of any part of the signal transmission layers 1200 which is configured to transmit the current is the same, that is, the thicknesses of the signal transmission layers 1200 are constant at any positions of the signal transmission layers 1200, and the occurrence of the defect in the related art that a part of the signal transmission layers corresponding to a junction of the metal base and the circuit board body is relatively thin may be reduced, so that the metal base 1400 in the circuit board body 1100 may achieve the large current-carrying function.

In an application scenario, as shown in FIG. 1, a plurality of blind holes 1310 may be defined in adhesive layer 1300 at a position corresponding to the metal base 1400. The first conductive element 1500 may include a plurality of conductive pillars 1510 arranged or formed in the plurality of blind holes 1310. The conductive pillars 1510 may be made of conductive materials such as copper, aluminum, and the like. In some embodiments, at least one blind hole 1310 may be defined between an end of the metal base 1400 and the corresponding signal transmission layers 1200 (for example, one, three, or more blind holes 1310 may be defined). Each blind hole 1310 is provided with the conductive pillar 1510 electrically connecting the corresponding signal transmission layers 1200 to the metal base 1400. In some embodiments, the blind hole 1310 may be in shape of an inverted trapezoid.

During the fabrication process of the embedded circuit board, the adhesive layer 1300 may be arranged or formed first on the side of the circuit board body 1100 from which the metal base 1400 is exposed. At least one blind hole 1310 may be defined in the adhesive layer 1300 at the position corresponding to the metal base 1400 by means of laser drilling or mechanical drilling. The conductive pillar 1510 may be further arranged or formed in the blind hole 1310. A size of each conductive pillar 1510 is substantially the same as or equal to a size of the hole 1310.

Figure 2:
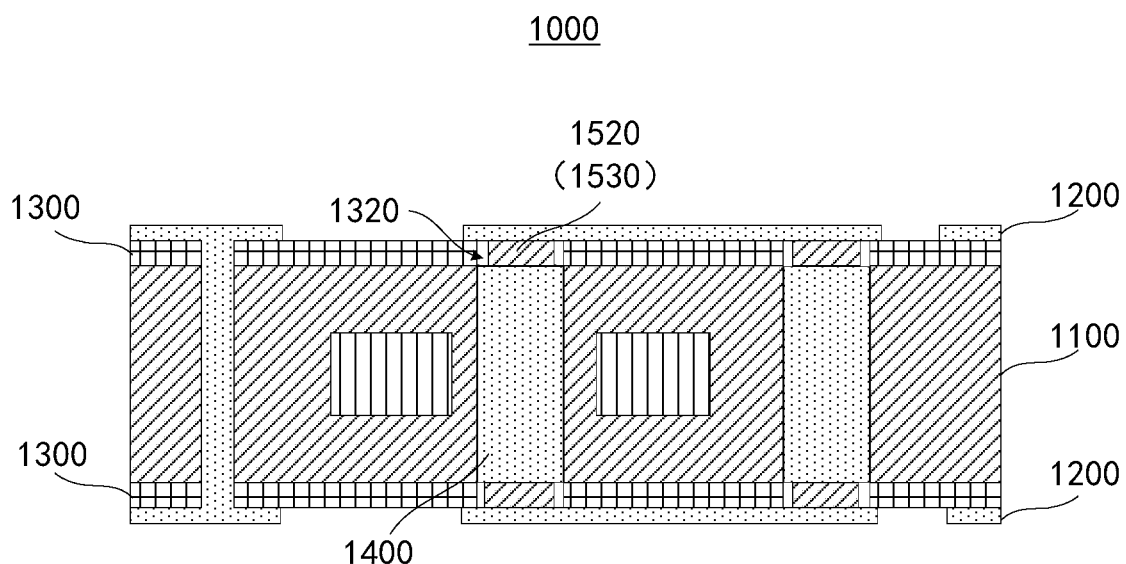
FIG. 2 is a schematic sectional view of the embedded circuit board shown in FIG. 1 in an application scenario.

In another application scenario, as shown in FIG. 2, an opening 1320 may be defined in the adhesive layer 1300 at the position corresponding to the metal base 1400. In some embodiments, a cross section of the opening 1320 may be in shape of a rectangle. In some embodiments, at least two openings 1320 may be provided, and the at least two openings 1320 may be arranged in a matrix when viewing from the top.

The first conductive element 1500 may include a conductive adhesive 1520 or a conductive paste 1530 arranged or formed in the opening 1320. In this case, during the fabrication process of the embedded circuit board, the adhesive layer 1300 may be arranged or formed first on the side of the circuit board body 1100 from which the metal base 1400 is exposed, and the opening 1320 may be defined in the adhesive layer 1300 at the position corresponding to the metal base 1400, then the conductive adhesive 1520 or the conductive paste 1530 may be arranged or formed in the opening 1320. A size of the conductive adhesive 1520 or that of the conductive paste 1530 is smaller than a size of the opening 1320. Or, the conductive adhesive 1520/the conductive paste 1530 may be arranged or formed first on the side of the circuit board body 1100 from which the metal base 1400 is exposed, and the adhesive layer 1300 may be arranged or formed on the other part or the rest of a surface of the circuit board body 1100 on which the conductive adhesive 1520/the conductive paste 1530 is arranged.

Of course, in other application scenarios, the first conductive element 1500 may also be a conductive element, such as a conductive copper block (not shown), and the like, arranged or formed in the adhesive layer 1300 at the position corresponding to the metal base 1400, and will not be repeatedly described herein.

In a word, the specific structure of the first conductive element 1500 will not be limited herein, as long as the first conductive element 1500 is arranged or formed in the adhesive layer 1300 at the position corresponding to the metal base 1400 and can electrically connect the corresponding signal transmission layers 1200 to the metal base 1400.

The magnetic core 1600 may be embedded in the circuit board body 1100. The material of magnetic core 1600 may be manganese zinc iron, nickel zinc iron, an amorphous magnetic material, or other materials. A cross section of the magnetic core 1600 may be in shape of a circle, a racetrack, 8, a square, and the like. In an application scenario, the magnetic core 1600 may in shape of a closed ring. In another application scenario, the magnetic core 1600 may be partially cut with slits. The structure, the shape, and the material of the magnetic core 1600 will not be limited herein in the present disclosure.

The embedded circuit board 1000 may be applied to electronic devices such as transformers, power modules, and the like.

As further shown in FIG. 1, in an application scenario, the number of metal bases 1400 may be two or more, such as two, four, or more. As shown in FIG. 1, two metal bases 1400 are shown for illustration. The two or more metal bases 1400 may include a first metal base 1410 and a second metal base 1420. The first metal base 1410 may penetrate the magnetic core 1600, and the second metal base 1420 may be arranged outside the magnetic core 1600.

Each signal transmission layer 1200 may include a wire pattern 1210, the wire pattern 1210 is obtained by patterning the entire conductive layer, and the wire pattern 1210 may be bridged between the first metal base 1410 and the second metal base 1420, such that a coil circuit capable of transmitting the current surrounding the magnetic core 1600 may be defined. It means that, in this application scenario, the coil circuit capable of transmitting the current surrounding the magnetic core 1600 may be defined through the mutual cooperation between the first metal base 1410, the second metal base 1420, and the wire pattern 1210 of each of the signal transmission layers 1200.

It should be noted that, when more than two metal bases 1400 are arranged, the remaining metal bases 1400 except the first metal base 1410 and the second metal base 1420 may be distributed in any wiring location that needs to achieve the large current-carrying function on the circuit board body 1100, which will not be limited herein.

Figure 3:
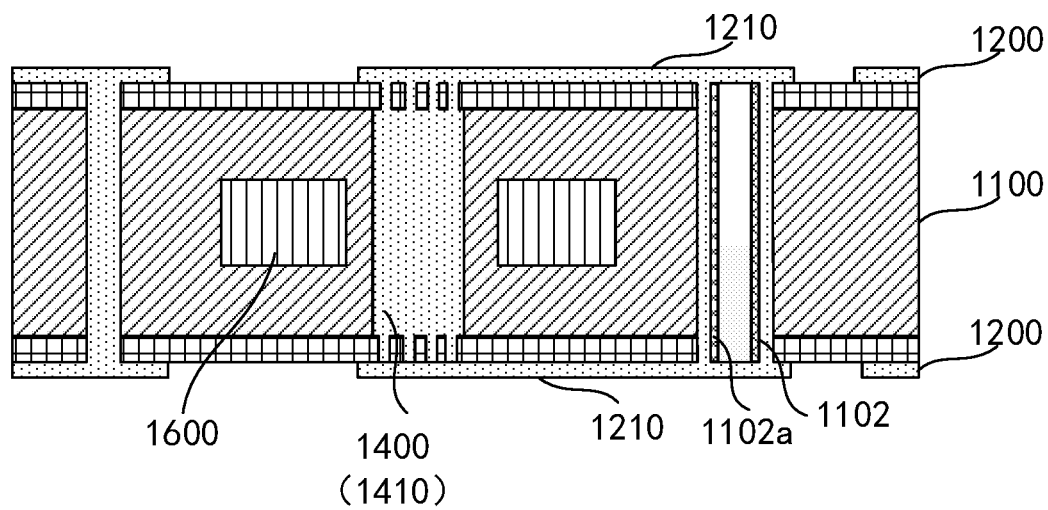
FIG. 3 is a schematic sectional view of the embedded circuit board shown in FIG. 1 in another application scenario.

As shown in FIG. 3, FIG. 3 is a schematic sectional view of the embedded circuit board shown in FIG. 1 in another application scenario. Different from the application scenario shown in FIG. 1, the number of metal base 1400 may be one or more, such as one, two, or more in the present embodiment. As shown in FIG. 3, one metal base 1400 is shown for illustration. The one or more metal base 1400 may include the first metal base 1410, and the first metal base 1410 may penetrate the magnetic core 1600.

The circuit board body 1100 may define a via hole 1102 arranged outside the magnetic core 1600. The wire pattern 1210 may be bridged between the first metal base 1410 and the via hole 1102. A second conductive element 1102*a* may be arranged or formed in the via hole 1102, and the via hole 1102 may be configured to electrically connect the wire patterns 1210 on the two signal transmission layers 1200. Therefore, the coil circuit capable of transmitting the current surrounding the magnetic core 1600 may be defined. That is, different from the above application scenarios, the coil circuit capable of transmitting the current surrounding the magnetic core 1600 may be defined through the mutual cooperation between the first metal base 1410, the second conductive element 1102*a* arranged in the via hole 1102, and the wire pattern 1210 of each of the signal transmission layers 1200 in the present embodiment.

The second conductive element 1102*a* arranged or formed in the via hole 1102 may be a conductive layer only coated on an inner wall of the via hole 1102 (as shown in FIG. 3), or may be the conductive material that fills the via hole 1102, which will not limited herein.

Figure 4:
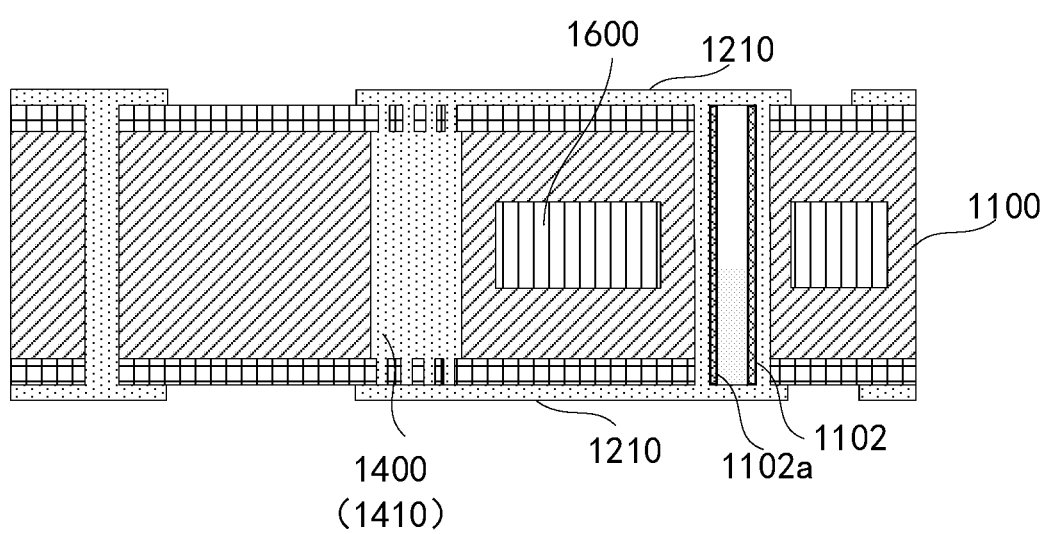
FIG. 4 is a schematic sectional view of the embedded circuit board shown in FIG. 1 in a further application scenario.

As shown in FIG. 4, FIG. 4 is a schematic sectional view of the embedded circuit board shown in FIG. 1 in a further application scenario. Similar to the application scenario in FIG. 3, in this application scenario, the number of metal bases 1400 may be one or more, such as one, two, or more. But different from the structure in FIG. 3, the first metal base 1410 may be arranged outside the magnetic core 1600, and the via hole 1102 may penetrate the magnetic core 1600. At this time, the coil circuit capable of transmitting the current surrounding the magnetic core 1600 may be defined through the mutual cooperation between the first metal base 1410, the wire pattern 1210 of each of the signal transmission layers 1200, and the second conductive element 1102*a* in the via hole 1102. That is, the wire pattern 1210 may be bridged between the first metal base 1410 and the via hole 1102, and the second conductive element 1102*a* may also be arranged or formed in the via hole 1102.

In above application scenario, the coil circuits capable of transmitting the current surrounding the magnetic core 1600 both use the metal base 1400. But in other application scenarios, the coil circuits capable of transmitting the current surrounding the magnetic core 1600 may be defined without the metal base 1400. For example, the coil circuit capable of transmitting the current may be defined by the via holes 1102 defined inside and outside the magnetic core 1600. In some embodiments, the wire pattern 1210 may be bridged between the via holes 1102 inside and outside the magnetic core 1600, and the second conductive element 1102*a* may be arranged or formed in the via holes 1102. Therefore, the coil circuit capable of transmitting the current surrounding the magnetic core 1600 may be defined through the mutual cooperation between the via holes 1102. In this case, the metal base 1400 may be arranged at any position of the circuit board body 1100 that needs to achieve the large current-carrying function.

As further shown in FIG. 1, in the present embodiment, the wire patterns 1210 on the signal transmission layers 1200 on both sides of the circuit board body 1100 may also achieve an electrical connection via a through hole 1700 provided with third conductive element, in addition to the metal base 1400. The third conductive element may be a conductive coating coated on the inner wall of the through hole 1700, or a solid conductive element inserted into the through hole 1700, or conductive materials that fill the through hole 1700. The number of the through holes 1700 may be one, two, or more, which will not be limited herein.

Figure 5:
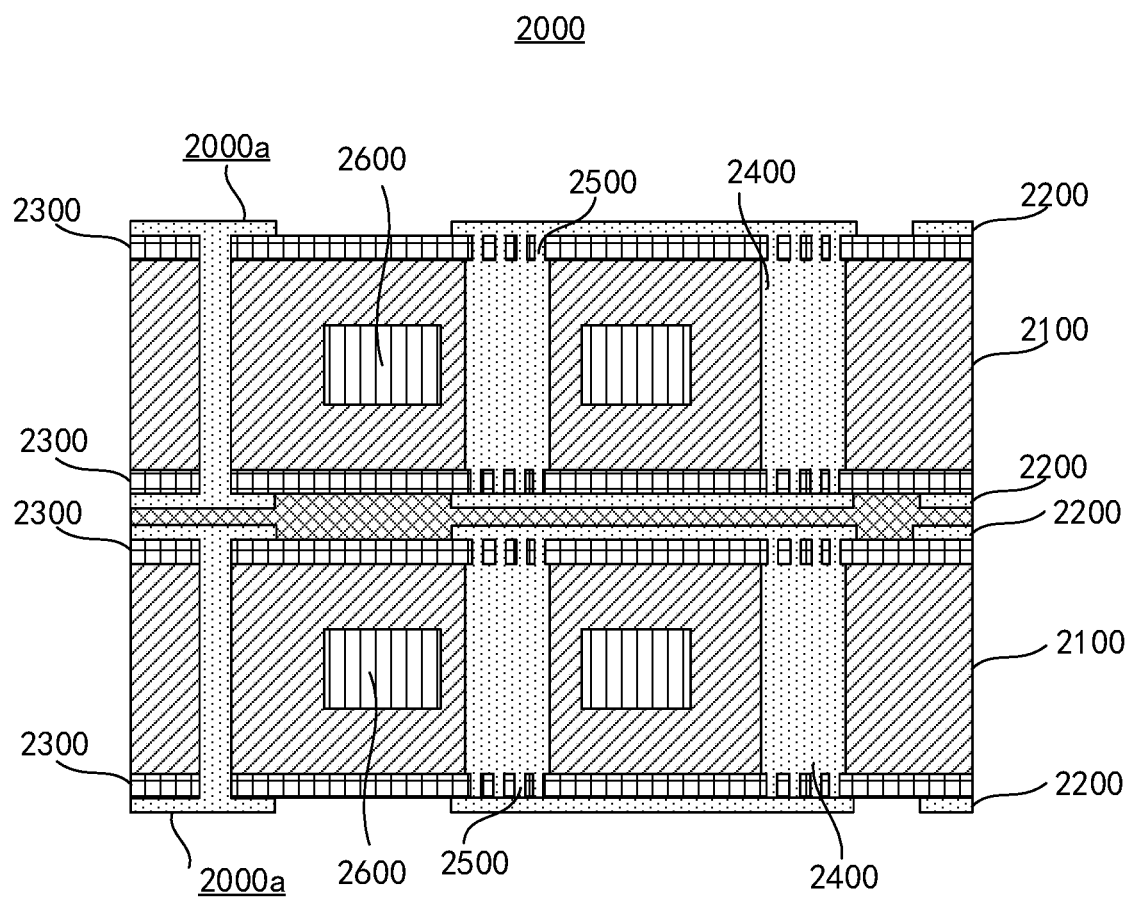
FIG. 5 is a schematic sectional view of an embedded circuit board according to some embodiments of the present disclosure.

As shown in FIG. 5, FIG. 5 is a schematic sectional view of an embedded circuit board according to some embodiments of the present disclosure. In the present embodiment, the embedded circuit board 2000 may include at least two circuit board units 2000a. The plurality of circuit board units 2000a may be stacked on one another. Each circuit board unit may both include the circuit board body 2100, the signal transmission layer 2200, the adhesive layer 2300, the metal base 2400, the first conductive element 2500 and the magnetic core 2600. Therefore, when the embedded circuit board 2000 has at least two circuit board units 2000a, the embedded circuit board 2000 includes at least two circuit board bodies 2100, such as two, three, or more circuit board bodies 2100. The at least two circuit board bodies 2100 may be stacked on one another, and the numbers of the signal transmission layers 2200, the adhesive layers 2300, the metal bases 2400, the first conductive elements 2500, the magnetic cores 2600, and the like are correspondingly increased compared with the above embodiments.

In some embodiments, the structure of the embedded circuit board 2000 will not be limited herein, any improvement made based on the core structure according to some embodiments of the present disclosure should be included within the protection scope of the present disclosure.

Figure 6:
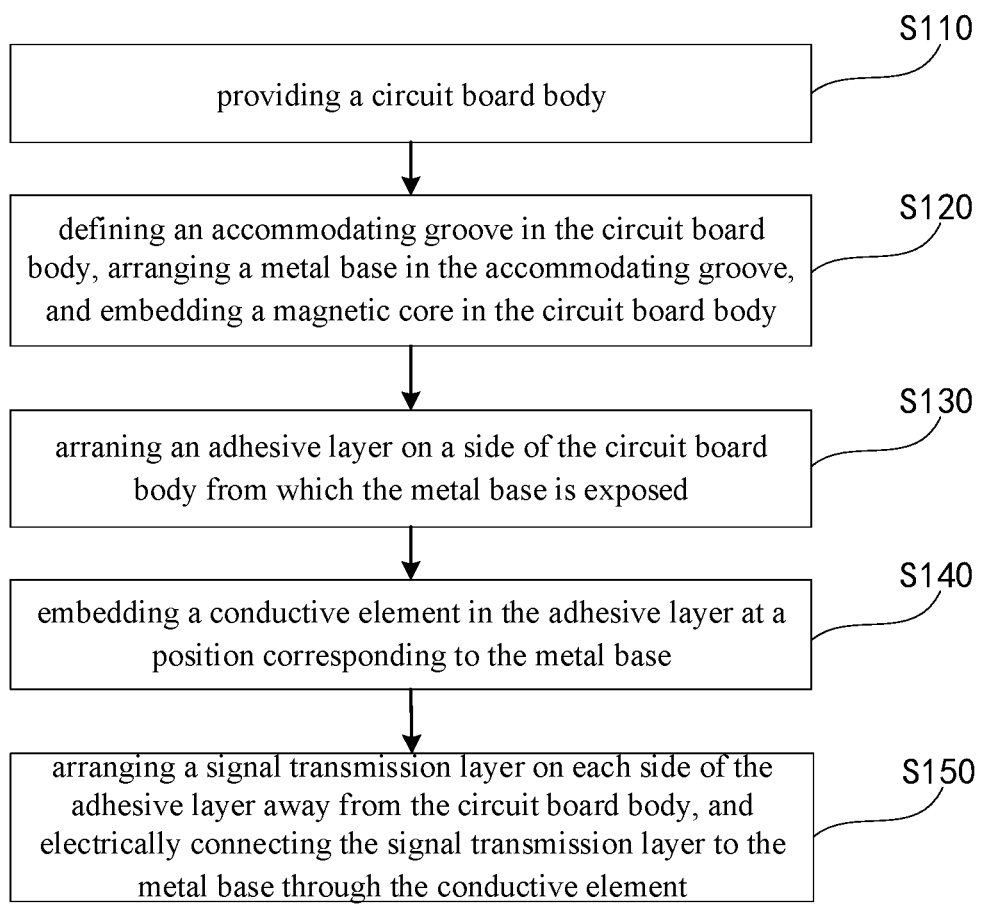
FIG. 6 is a flow chart of a method for fabricating an embedded circuit board according to some embodiments of the present disclosure.
Figure 7:
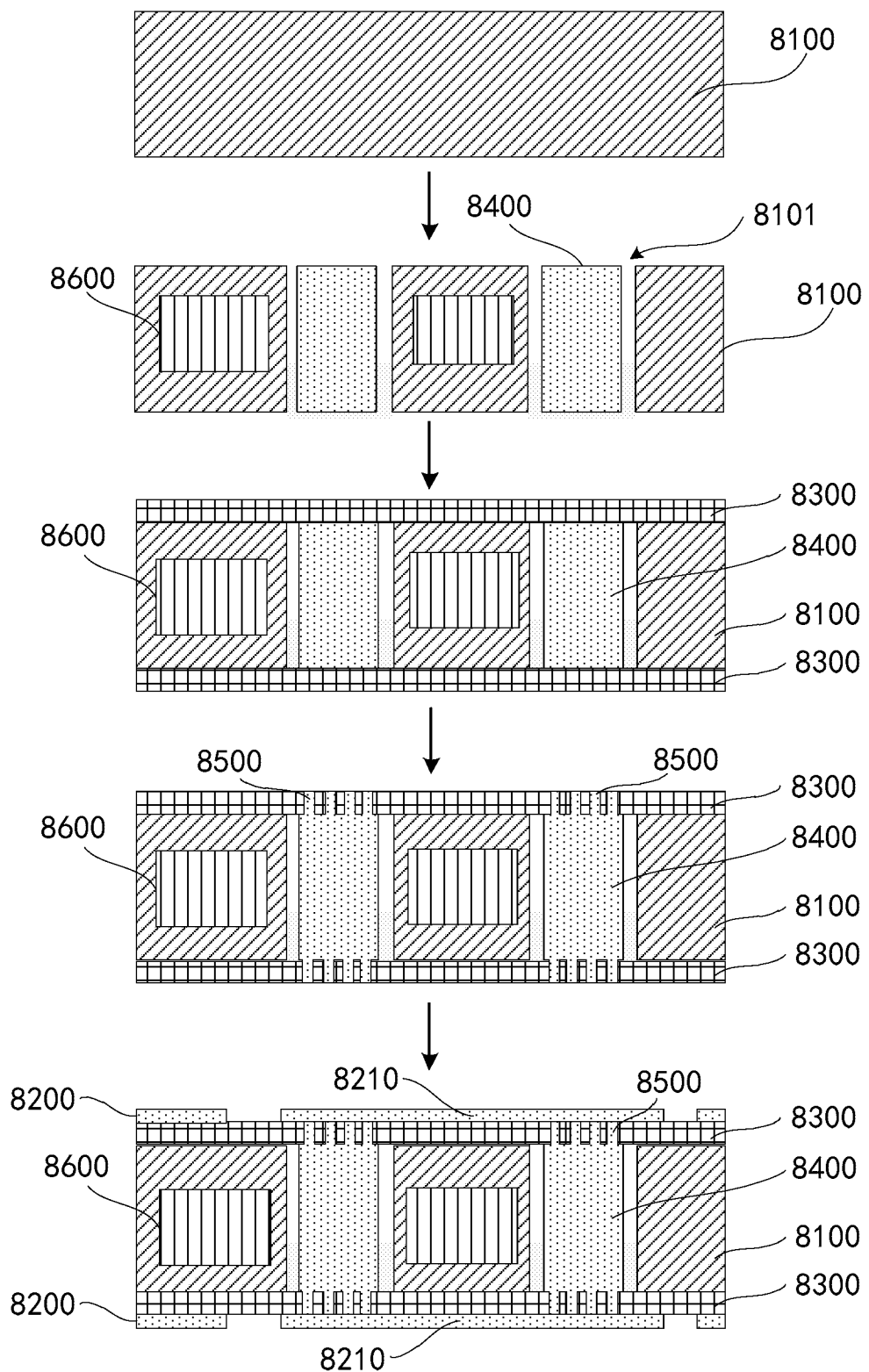
FIG. 7 is a schematic view illustrating a fabrication process corresponding to the method shown in FIG. 6.

As shown in FIG. 6, FIG. 6 is a flow chart of a method for fabricating an embedded circuit board according to some embodiments of the present disclosure. Combined with FIG. 7, the method may include following operations.

In an operation S110, a circuit board body 8100 may be provided. In some embodiments, the circuit board body 8100 may be fabricated.

In an operation S120, an accommodating groove 8101 may be defined in the circuit board body 8100, a metal base 8400 may be arranged in the accommodating groove 8101, and the magnetic core 8600 may be embedded in the circuit board body 8100. In some embodiments, the magnetic core 8600 and the metal base 8400 may be embedded in the circuit board body 8100 simultaneously.

In an application scenario, the accommodating groove 8101 may be the through groove penetrating the circuit board body 8100, and a thickness of the metal base 8400 is substantially the same as or equal to a thickness of the circuit board body 8100.

In an application scenario, the circuit board body 8100 and the metal base 8400 may be pressed to form a fixed structure, after the metal base 8400 is arranged or placed in the accommodating groove 8101.

In an operation S130, an adhesive layer 8300 may be arranged or formed on a side of the circuit board body 8100 from which the metal base 8400 is exposed.

In an operation S140, a first conductive element 8500 may be embedded in the adhesive layer 8300 at a position corresponding to the metal base 8400.

In an operation S150, a signal transmission layer 8200 may be arranged or formed on a side of the adhesive layer 8300 away from the circuit board body 8100, and the signal transmission layer 8200 may be electrically connected to the metal base 8400 through the first conductive element 8500.

In an application scenario, the operation 150 specifically includes the following operations: covering a copper foil (not shown) on the side of the adhesive layer 8300 away from the circuit board body 8100 such that the copper foil may be bonded to the circuit board body 8100 through the adhesive layer 8300, and the copper foil may be electrically connected to the metal base 8400 through the first conductive element 8500; and patterning the copper foil to form the signal transmission layers 8200 including a wire pattern 8210. That is, the material of the signal transmission layers 8200 is copper in this case.

The structure of the embedded circuit board fabricated by the method according to the present embodiment is same as or similar to the structure of the embedded circuit board in any of the above embodiments. The specific structure may refer to the above embodiments, and will not be repeatedly described In conclusion, in the embedded circuit board in some embodiments of the present disclosure, the metal base arranged in the circuit board body may be electrically connected to the signal transmission layers through the conductive element. During the fabrication process of the embedded circuit board, the adhesive layer may be arranged or formed first on the side of the circuit board body from which the metal base is exposed after the metal base is arranged in the circuit board body, and the recess may be defined in the adhesive layer at the position corresponding to the metal base, and the conductive element may be arranged or formed in the recess (or the conductive element may be arranged or formed at a position corresponding to the metal base first, and the adhesive layer may be arranged or formed after that). After that, an entire conductive layer may be defined on one side of the adhesive layer away from the circuit board body. The signal transmission layers may be arranged or formed by using the entire conductive layer subsequently. Therefore, it may ensure that the thickness of any part of the signal transmission layers which is configured to transmit the current is the same, so that the metal base of the embedded circuit board may be ensured to achieve the large current-carrying function. Besides, the magnetic core and the metal base may be both embedded in circuit board body. Therefore, a volume of the circuit board may be decreased, and a heat dissipation property of the circuit board may be improved.

In a first aspect, an embedded circuit board, including: a circuit board body; two signal transmission layers, arranged on opposite sides of the circuit board body; an adhesive layer, arranged between the circuit board body and at least one of the signal transmission layers, and configured to bond the signal transmission layers to the circuit board body; one or more metal bases, embedded in the circuit board body and electrically connected to the signal transmission layers arranged on the opposite sides of the circuit board body; a first conductive element, arranged in the adhesive layer at a position corresponding to the one or more metal bases and electrically connect the signal transmission layers to the one or more metal bases; and a magnetic core, embedded in the circuit board body.

In some embodiments, a plurality of holes are defined in the adhesive layer at the position corresponding to the one or more metal bases, and the first conductive element includes a conductive pillar arranged in each of the plurality of holes.

In some embodiments, an opening is defined in the adhesive layer at the position corresponding to the one or more metal bases, and the first conductive element includes a conductive adhesive or a conductive paste arranged in the opening.

In some embodiments, the one or more metal bases include a first metal base and a second metal base, the first metal base penetrates the magnetic core, and the second metal base is arranged outside the magnetic core; and each of the signal transmission layers includes a wire pattern, the wire pattern is bridged between the first metal base and the second metal base, and a coil circuit capable of transmitting a current surrounding the magnetic core is defined by the wire pattern of each of the signal transmission layers, the first metal base, and the second metal base.

In some embodiments, the one or more metal bases includes a first metal base, and the first metal base penetrates the magnetic core; the circuit board body defines a via hole arranged outside the magnetic core, each of the signal transmission layers include a wire pattern, and the wire pattern is bridged between the first metal base and the via hole; and a second conductive element is arranged in the via hole and configured to electrically connect the wire pattern of one of the signal transmission layers and the wire pattern of the other of the signal transmission layers, and a coil circuit capable of transmitting a current surrounding the magnetic core is defined by the wire pattern of each of the signal transmission layers, the second conductive element, and the first metal base.

In some embodiments, the one or more metal bases include a first metal base, and the first metal base is arranged outside the magnetic core; the circuit board body defines a via hole arranged outside the magnetic core, each of the signal transmission layers include a wire pattern, and the wire pattern is bridged between the first metal base and the via hole; a second conductive element is arranged in the via hole and configured to electrically connect the wire pattern of one of the signal transmission layers and the wire pattern of the other of the signal transmission layers, and a coil circuit capable of transmitting a current surrounding the magnetic core is defined by the wire pattern of each of the signal transmission layers, the second conductive element, and the first metal base.

In some embodiments, a cross section of the metal base along a thickness direction of the metal base is rectangular or T-shaped.

In some embodiments, the embedded circuit board includes at least two circuit board units, each of the at least two circuit board units include the circuit board body, the two signal transmission layers, the adhesive layer, the one or more metal bases, the first conductive element, and the magnetic core; the at least two circuit board units are stacked on one another.

In some embodiments, the one or more metal bases are made of at least one of copper or aluminium; or the magnetic core made of is manganese zinc iron, nickel zinc iron, or an amorphous magnetic material.

In some embodiments, a cross section of the magnetic core is circular, racetrack-shaped, 8-shaped, or square.

In some embodiments, the adhesive layer is arranged between each of the signal transmission layers and the circuit board body.

In some embodiments, the adhesive layer is arranged between the circuit board body and one of the signal transmission layers, and the other of the signal transmission layers directly contacts with the circuit board body.

In some embodiments, a through groove is defined in the circuit board body, the metal base is arranged in the through groove, and an inner size of the groove is greater than or substantially equal to an outer size of the metal base.

In a second aspect, an electronic device, including an embedded circuit board: a substrate, having a first side and a second side opposite to the first side; a first conductive layer, located on the first side of the substrate; a second conductive layer, located on the second side of the substrate; an adhesive layer, arranged on at least one of the first conductive layer and the second conductive layer; a conductive element, arranged in the adhesive layer and having two opposite ends exposed from the adhesive layer; and one or more metal bases, embedded in the substrate and electrically connected to the first conductive layer and the second conductive layer via the conductive element; a magnetic core, embedded in the substrate; each of the first conductive layer and the second conductive layer is configured to transmit a current and has a substantially constant thickness; and the first conductive layer, the second conductive layer, and the one or more metal bases cooperatively defines a coil circuit surrounding the magnetic core.

In some embodiments, the one or more metal bases include a first metal base and a second metal base, the first metal base penetrates the magnetic core, and the second metal base is arranged outside the magnetic core; and each of the first conductive layer and the second conductive layer includes a wire pattern, the wire pattern is bridged between the first metal base and the second metal base, and the coil circuit is defined by the wire pattern of each of the first conductive layer and the second conductive layer, the first metal base, and the second metal base.

In some embodiments, the one or more metal bases includes a first metal base, and the first metal base penetrates the magnetic core; the circuit board body defines a via hole arranged outside the magnetic core, each of the first conductive layer and the second conductive layer includes a wire pattern, and the wire pattern is bridged between the first metal base and the via hole; and a second conductive element is arranged in the via hole and configured to electrically connect the wire pattern of one of the first conductive layer and the second conductive layer and the wire pattern of the other of the first conductive layer and the second conductive layer, and the coil circuit is defined by the second conductive element, the first metal base, and the wire pattern of each of the first conductive layer and the second conductive layer.

In some embodiments, the one or more metal bases include a first metal base, and the first metal base is arranged outside the magnetic core; the circuit board body defines a via hole arranged outside the magnetic core, each of the first conductive layer and the second conductive layer includes a wire pattern, and the wire pattern is bridged between the first metal base and the via hole; and a second conductive element is arranged in the via hole and configured to electrically connect the wire pattern of one of the first conductive layer and the second conductive layer and the wire pattern of the other of the first conductive layer and the second conductive layer, and the coil circuit is defined by the second conductive element, the first metal base, and the wire pattern of each of the first conductive layer and the second conductive layer.

In a third aspect, A method for fabricating an embedded circuit board, including: providing a circuit board body; defining an accommodating groove in the circuit board body, arranging a metal base in the accommodating groove, and embedding a magnetic core in the circuit board body; arranging an adhesive layer on a side of the circuit board body from which the metal base is exposed; embedding a conductive element in the adhesive layer at a position corresponding to the metal base; and arranging a signal transmission layer on each side of the adhesive layer away from the circuit board body, and electrically connecting the signal transmission layer to the metal base through the conductive element.

In some embodiments, arranging the signal transmission layer on the side of the adhesive layer away from the circuit board body, and electrically connecting the signal transmission layer to the metal base through the conductive element, includes: covering a copper foil on the side of the adhesive layer away from the circuit board body; bonding the copper foil to the circuit board body through the adhesive layer, the copper foil is electrically connected to the metal base through the conductive element; and patterning the copper foil to form the signal transmission layer.

In some embodiments, arranging a signal transmission layer on each side of the adhesive layer away from the circuit board body includes: arranging a conductive layer on each side of the adhesive layer away from the circuit board body; and patterning the conductive layer and forming the signal transmission layer electrically connected to the metal base through the conductive element.

The embodiments disclosed above are exemplary only and shall not be interpreted as limiting the scope of the embodiments of the present disclosure. Therefore, any equivalent structure or equivalent process modification used according to the contents of the specification and accompanying drawings in the present disclosure, no matter whether it is directly or indirectly used in any other related technical field, should be included within the protection scope of the present disclosure.

What is claimed is:

1. An embedded circuit board, comprising:
   a circuit board body;
   two signal transmission layers, arranged on opposite sides of the circuit board body;
   an adhesive layer, arranged between the circuit board body and at least one of the signal transmission layers, and configured to bond the signal transmission layers to the circuit board body;
   one or more metal bases, embedded in the circuit board body and electrically connected to the signal transmission layers arranged on the opposite sides of the circuit board body;
   a first conductive element, arranged in the adhesive layer at a position corresponding to the one or more metal bases and electrically connect the signal transmission layers to the one or more metal bases; and
   a magnetic core, embedded in the circuit board body.

2. The embedded circuit board according to claim 1, wherein a plurality of blind holes are defined in the adhesive layer at the position corresponding to the one or more metal bases, and the first conductive element comprises a conductive pillar arranged in each of the plurality of blind holes.

3. The embedded circuit board according to claim 1, wherein an opening is defined in the adhesive layer at the position corresponding to the one or more metal bases, and the first conductive element comprises a conductive adhesive or a conductive paste arranged in the opening.

4. The embedded circuit board according to claim 1, wherein the one or more metal bases comprise a first metal base and a second metal base, the first metal base penetrates the magnetic core, and the second metal base is arranged outside the magnetic core; and
   each of the signal transmission layers comprises a wire pattern, the wire pattern is bridged between the first metal base and the second metal base, and a coil circuit capable of transmitting a current surrounding the magnetic core is defined by the wire pattern of each of the signal transmission layers, the first metal base, and the second metal base.

5. The embedded circuit board according to claim 1, wherein the one or more metal bases comprises a first metal base, and the first metal base penetrates the magnetic core;
   the circuit board body defines a via hole arranged outside the magnetic core, each of the signal transmission layers comprise a wire pattern, and the wire pattern is bridged between the first metal base and the via hole; and
   a second conductive element is arranged in the via hole and configured to electrically connect the wire pattern of one of the signal transmission layers and the wire pattern of the other of the signal transmission layers, and a coil circuit capable of transmitting a current surrounding the magnetic core is defined by the wire pattern of each of the signal transmission layers, the second conductive element, and the first metal base.

6. The embedded circuit board according to claim 1, wherein the one or more metal bases comprise a first metal base, and the first metal base is arranged outside the magnetic core;
   the circuit board body defines a via hole arranged outside the magnetic core, each of the signal transmission layers comprise a wire pattern, and the wire pattern is bridged between the first metal base and the via hole;
   a second conductive element is arranged in the via hole and configured to electrically connect the wire pattern of one of the signal transmission layers and the wire pattern of the other of the signal transmission layers, and a coil circuit capable of transmitting a current surrounding the magnetic core is defined by the wire pattern of each of the signal transmission layers, the second conductive element, and the first metal base.

7. The embedded circuit board according to claim 1, wherein a cross section of the metal base along a thickness direction of the metal base is rectangular or T-shaped.

8. The embedded circuit board according to claim 1, wherein the embedded circuit board comprises at least two circuit board units, each of the at least two circuit board units comprise the circuit board body, the two signal transmission layers, the adhesive layer, the one or more metal bases, the first conductive element, and the magnetic core;
   the at least two circuit board units are stacked on one another.

9. The embedded circuit board according to claim 1, wherein the one or more metal bases are made of at least one of copper or aluminium; or
   the magnetic core made of is manganese zinc iron, nickel zinc iron, or an amorphous magnetic material.

10. The embedded circuit board according to claim 1, wherein a cross section of the magnetic core is circular, racetrack-shaped, 8-shaped, or square.

11. The embedded circuit board according to claim 1, wherein the adhesive layer is arranged between each of the signal transmission layers and the circuit board body.

12. The embedded circuit board according to claim 1, wherein the adhesive layer is arranged between the circuit board body and one of the signal transmission layers, and the other of the signal transmission layers directly contacts with the circuit board body.

13. The embedded circuit board according to claim 1, wherein a through groove is defined in the circuit board body, the metal base is arranged in the through groove, and an inner size of the groove is greater than or substantially equal to an outer size of the metal base.

14. An electronic device, comprising an embedded circuit board:
a substrate, having a first side and a second side opposite to the first side;
a first conductive layer, located on the first side of the substrate;
a second conductive layer, located on the second side of the substrate;
an adhesive layer, arranged on at least one of the first conductive layer and the second conductive layer;
a conductive element, arranged in the adhesive layer and having two opposite ends exposed from the adhesive layer; and
one or more metal bases, embedded in the substrate and electrically connected to the first conductive layer and the second conductive layer via the conductive element;
a magnetic core, embedded in the substrate;
wherein each of the first conductive layer and the second conductive layer is configured to transmit a current and has a substantially constant thickness; and
wherein the first conductive layer, the second conductive layer, and the one or more metal bases cooperatively defines a coil circuit surrounding the magnetic core.

15. The electronic device according to claim 14, wherein the one or more metal bases comprise a first metal base and a second metal base, the first metal base penetrates the magnetic core, and the second metal base is arranged outside the magnetic core; and
each of the first conductive layer and the second conductive layer comprises a wire pattern, the wire pattern is bridged between the first metal base and the second metal base, and the coil circuit is defined by the wire pattern of each of the first conductive layer and the second conductive layer, the first metal base, and the second metal base.

16. The electronic device according to claim 14, wherein the one or more metal bases comprises a first metal base, and the first metal base penetrates the magnetic core;
the circuit board body defines a via hole arranged outside the magnetic core, each of the first conductive layer and the second conductive layer comprises a wire pattern, and the wire pattern is bridged between the first metal base and the via hole; and
a second conductive element is arranged in the via hole and configured to electrically connect the wire pattern of one of the first conductive layer and the second conductive layer and the wire pattern of the other of the first conductive layer and the second conductive layer, and the coil circuit is defined by the second conductive element, the first metal base, and the wire pattern of each of the first conductive layer and the second conductive layer.

17. The electronic device according to claim 14, wherein the one or more metal bases comprise a first metal base, and the first metal base is arranged outside the magnetic core;
the circuit board body defines a via hole arranged outside the magnetic core, each of the first conductive layer and the second conductive layer comprises a wire pattern, and the wire pattern is bridged between the first metal base and the via hole; and
a second conductive element is arranged in the via hole and configured to electrically connect the wire pattern of one of the first conductive layer and the second conductive layer and the wire pattern of the other of the first conductive layer and the second conductive layer, and the coil circuit is defined by the second conductive element, the first metal base, and the wire pattern of each of the first conductive layer and the second conductive layer.

18. A method for fabricating an embedded circuit board, comprising:
providing a circuit board body;
defining an accommodating groove in the circuit board body, arranging a metal base in the accommodating groove, and embedding a magnetic core in the circuit board body;
arranging an adhesive layer on a side of the circuit board body from which the metal base is exposed;
embedding a conductive element in the adhesive layer at a position corresponding to the metal base; and
arranging a signal transmission layer on each side of the adhesive layer away from the circuit board body, and electrically connecting the signal transmission layer to the metal base through the conductive element.

19. The method according to claim 18, wherein the arranging the signal transmission layer on the side of the adhesive layer away from the circuit board body, and electrically connecting the signal transmission layer to the metal base through the conductive element, comprises:
covering a copper foil on the side of the adhesive layer away from the circuit board body;
bonding the copper foil to the circuit board body through the adhesive layer, wherein the copper foil is electrically connected to the metal base through the conductive element; and
patterning the copper foil to form the signal transmission layer.

20. The method according to claim 18, wherein the arranging the signal transmission layer on each side of the adhesive layer away from the circuit board body comprises:
arranging a conductive layer on each side of the adhesive layer away from the circuit board body; and
patterning the conductive layer and forming the signal transmission layer electrically connected to the metal base through the conductive element.

* * * * *